(12) United States Patent
Bieck et al.

(10) Patent No.: US 9,063,407 B2
(45) Date of Patent: Jun. 23, 2015

(54) PHOTOLITHOGRAPHY MASK METHOD FOR A WAFER, METHOD FOR PRODUCING SAME, AND PHOTOLITHOGRAPHY METHOD FOR WAFER USING THE SAME

(75) Inventors: Florian Bieck, Bad Nenndorf (DE); Sven Spiller, Hannover (DE)

(73) Assignee: DISCO CORPORATION, Tokyo (JP)

( * ) Notice: Subject to any disclaimer, the term of this patent is extended or adjusted under 35 U.S.C. 154(b) by 303 days.

(21) Appl. No.: 13/814,882

(22) PCT Filed: Aug. 10, 2011

(86) PCT No.: PCT/IB2011/053565
§ 371 (c)(1),
(2), (4) Date: May 20, 2013

(87) PCT Pub. No.: WO2012/020382
PCT Pub. Date: Feb. 16, 2012

(65) Prior Publication Data
US 2013/0260291 A1    Oct. 3, 2013

(30) Foreign Application Priority Data
Aug. 10, 2011 (WO) .................. PCT/IB2010/053612

(51) Int. Cl.
*G03F 1/50* (2012.01)
*G03F 1/00* (2012.01)

(52) U.S. Cl.
CPC ... *G03F 1/00* (2013.01); *G03F 1/14* (2013.01)

(58) Field of Classification Search
CPC ........................................................ G03F 1/14
USPC .................................................. 430/5, 325
See application file for complete search history.

(56) References Cited

U.S. PATENT DOCUMENTS

| | | |
|---|---|---|
| 2006/0166111 A1 | 7/2006 | Umetsu et al. |
| 2010/0021577 A1 | 1/2010 | Stewart et al. |
| 2011/0260296 A1 | 10/2011 | Bieck et al. |
| 2012/0299610 A1 | 11/2012 | Bieck |

FOREIGN PATENT DOCUMENTS

| | | |
|---|---|---|
| JP | 55-126247 | 9/1980 |
| JP | 5-173317 | 7/1993 |
| JP | 2001-13676 | 1/2001 |
| WO | 2008 048215 | 4/2008 |
| WO | 2009 141740 | 11/2009 |
| WO | 2010 082094 | 7/2010 |

OTHER PUBLICATIONS

International Search Report Issued Feb. 6, 2012 in PCT/IB11/53565 Filed Aug. 10, 2011.
Office Action issued May 12, 2015 in Japanese Patent Application No. 2013-523693 (with English translation).

*Primary Examiner* — Stephen Rosasco
(74) *Attorney, Agent, or Firm* — Oblon, McClelland, Maier & Neustadt, L.L.P.

(57) ABSTRACT

A photolithography mask for a semiconductor wafer. The mask includes a protrusion section that protrudes from a handling section of the mask. An outer shape of the handling section enables handling by a mask aligner device. The protrusion includes a face surface provided at a level which is different from a face surface area of the handling section.

15 Claims, 6 Drawing Sheets

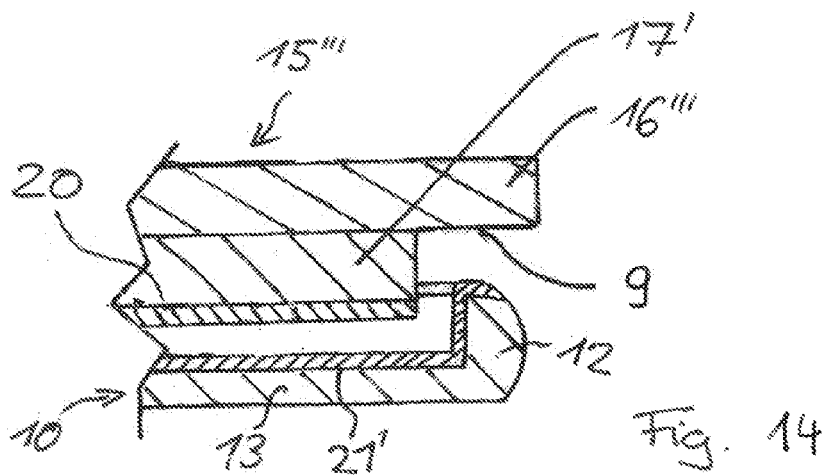
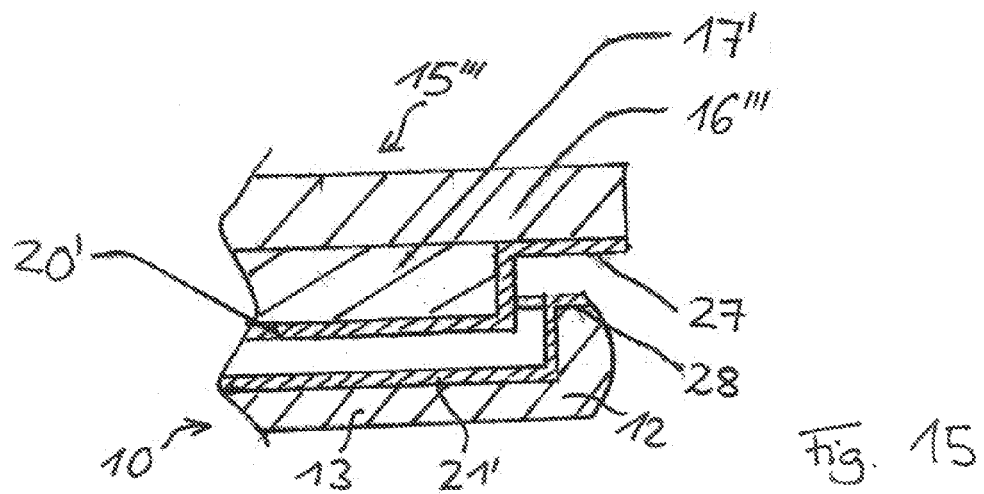
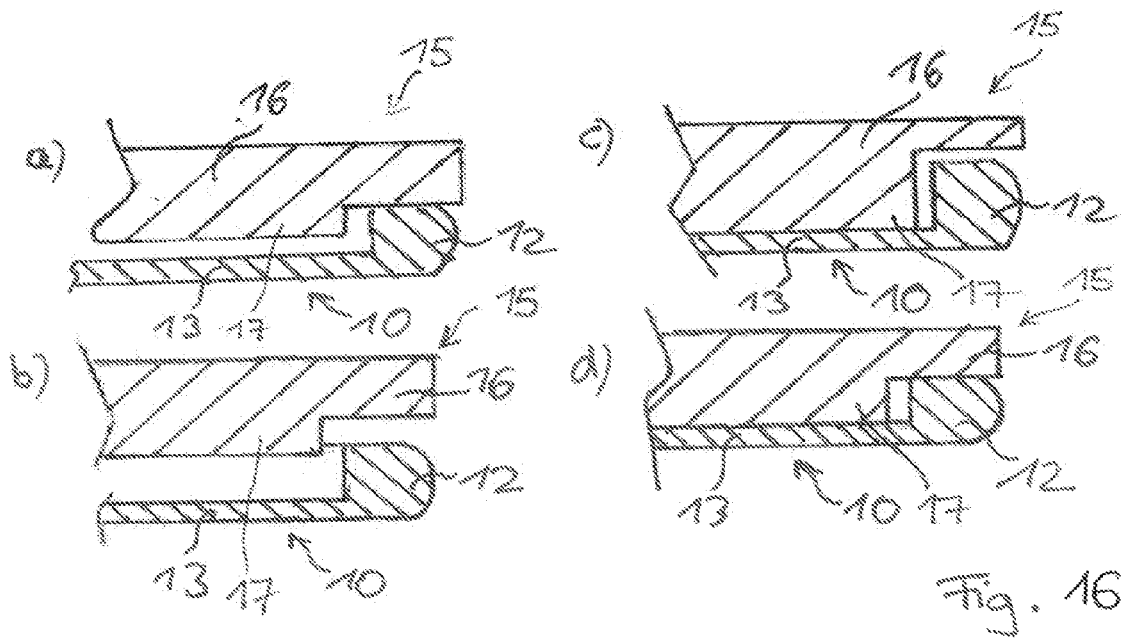

PHOTOLITHOGRAPHY MASK METHOD FOR A WAFER, METHOD FOR PRODUCING SAME, AND PHOTOLITHOGRAPHY METHOD FOR WAFER USING THE SAME

FIELD

The application relates to wafer photolithography using a mask aligner.

BACKGROUND

Several methods are known to illuminate a photoresist on a wafer. According to a first method, a stepper is used to illuminate the wafer. According to another method, a single mask for a wafer is used. Thereby, only one exposition per wafer is required.

In a typical process, a photostructurable polymer is spun onto the wafer by a spinning-process such that the polymer with a thickness in the micrometer range is obtained. Other methods are used as well to bring a photostructurable polymer onto a wafer, for example coating with a laminated dry film.

For photolithography, a mask is placed above the wafer and illuminated from above. The mask usually has a substrate made of glass, whereas the defining structures are made of a chrome layer on the bottom side of the mask. In a so called mask aligner, light is coming from a light source and through an optical system towards the mask. The light is blocked at the chrome layer of the mask, but it is passing the areas not covered by chrome. The mask is usually of a square format, whereas the length of the square is some centimeters larger than the diameter of the wafer, so that the mask holder of the aligner does not interfere with the wafer or the optical path of the light. Thus, the mask can be of a round format, as long the outer diameter is larger than the diameter of the wafer, so that the mask holder of the aligner does not interfere with the wafer or the optical path of light.

The light that passes through the mask initiates a photochemical reaction on the resist. In a positive-type resist, the exposed area is removed after development, in a negative-type resist, the non-exposed areas are removed after development. The resolution of structures is limited by the diffraction of light at the chrome structures of the mask. The light passing through the chrome structures is bent at these structures. While the incoming light at the mask can be considered as parallel, the light passing through the mask is not parallel anymore and is diverging.

The relationship between the gap and the resolution of the resist can be approximated by a critical distance CD. The critical distance CD, that is the smallest feature that can be achieved by using a mask aligner operated under the gap s is given by the following relationship:

$$CD_{min} \approx \sqrt{\lambda\left(s + \frac{1}{2}t\right)}.$$

Herein, CD is the critical distance, lambda (λ) is the wavelength of the light used for exposure, s is the gap width between the mask and the wafer and t is the thickness of the resist. It can be seen quantitatively that the critical distance increases with a higher gap t and thus the resolution decreases.

This diffraction of light limits the resolution and accuracy of the lithography process. It is desirable to minimize the effect of diffraction to reproduce structures with the highest possible contrast to have well defined features in the resist.

The diffraction of the light at the chrome layer cannot be avoided fully, but it can technically be minimized to an acceptable level. This is done by minimizing the "gap", the distance between the mask and the wafer. By doing so, the impact of the diffraction is kept under control. Typically, the gap is kept at only 20-80 μm. It is also possible to have essentially no gap, which is called "full contact mode". Here, the diffraction is minimal.

Apart from mask aligners and steppers, other optical systems by which lithography can be done are known. Projection systems do not use parallel light, but use an optical set up that projects the pattern of the mask onto the wafer—in this set up, the diffraction is minimized, yet not eliminated, and the mask can be placed at a wider distance to the wafer.

For certain application of semiconductors, it is desirable to have lithographic structures on both sides of the wafer. Such applications include Through Silicon Via applications, which are characterized by having integrated circuits on the one side, electrical structures on the other side, and electrically conductive structures through the Silicon to electrically connect both sides.

For such TSV applications, it is furthermore desirable to minimize the thickness of the Silicon wafer. The reason for this is mainly driven by the fact that the chips that are generated from these TSV wafers will later be assembled into stacks. Typically, the desired Silicon thickness is less than 150 μm. If Silicon is thinned to this thickness, it becomes very brittle and bends under its own weight.

To overcome the problem of thin Silicon, carrier-less systems have been proposed in the state of the art. Common characteristic of these concepts is that the wafer is reinforced by a structure at the rim, whereas the centre portion of the wafer is thinned to the desired thickness. The reinforcement structure at the rim gives the wafer enough mechanical stability, whereas the central portion can be very thin. In the context of this application, a thinned wafer with such a support structure at the outer rim is also referred to as a "rim wafer".

SUMMARY

It is an object of the application to provide an improved apparatus and method for performing lithography on semiconductor wafers. Specifically, it refers to a method and apparatus to improve lithography for a wafer having a supporting structure at the outer rim and a thinned inner portion, as described in prior art. Even more specifically, it refers to an improved method and apparatus for lithography for through-Silicon-Via (TSV) wafers.

According to the application, a modified mask is provided for lithography processing of the inner portion of a rim wafer. The inner portion is usually thinned down to ca. 50-100 μm. By using a conventional mask, the gap from the surface of the inner portion of the wafer to the chrome layer of the mask is at least 600-650 μm, if the "full contact mode" is used. If some additional gap between the supporting rim and the mask is used, the gap will be higher by this "safety margin".

A modified mask according to the application provides a high-resolution lithography by allowing to keep the gap below a distance of 60 μm, which is often used in standard applications. Moreover, the application provides a solution that minimizes the diffraction by modifying the mask, whereas the aligner by itself is not modified. This has the additional benefit that already existing production systems can be used without any additional costs.

A further benefit of using a mask aligner with a mask according to the application is to provide a simple optical set up, which is based on parallel light, and is therefore cheaper and less complicated as compared to projection aligners.

In a general embodiment, the application provides a mask for photolithography of a semiconductor wafer which comprises a protrusion section that protrudes from a handling section of the mask. The outer shape of the handling section is provided for handling by a mask aligner device. The handling section is adapted to fit into the mask aligner device, for example by using a square shape. A face surface of the protrusion is provided at a level which is different from a face surface area of the handling section. Thereby, the face surface of the protrusion can be brought closer to an inner thinned surface of a rim wafer.

To facilitate alignment, the protrusion section is preferentially of a round shape. To facilitate insertion of the protrusion into a support structure of a rim wafer, the radius of the round protrusion is made slightly smaller than a radius of a supporting structure at a rim of the rim wafer.

In an embodiment according to the application, the face surface area of the handling section that is at a different level from the face surface area of the protrusion is provided by a circular groove.

The circular groove may be shaped in various ways, for example to facilitate the positioning of the mask. In one embodiment, the groove comprises a ramp towards an edge portion of the handling section. The circular groove may furthermore comprise a rounded portion towards an edge portion of the handling section. The circular groove may also comprise a sigmoid shaped portion towards an edge portion of the mask. The groove may also have an outline other than circular to provide a non-circular protrusion.

In one embodiment, the handling section has a square shape and the protrusion has a circular shape. This allows for easy insertion into existing mask aligner and, at the same time, easy alignment of the wafer.

A mask according to the application may also be designed in a way that a cut-out is provided in the centre of the handling section and wherein the protrusion is provided in the cut-out. Thereby, the protrusion can be replaced while keeping the handling section. Furthermore, a mask according to the application may also be designed as a composite structure in which a protrusion is fixed, for example glued, to the handling structure. The composite structure can be harnessed to provide parts with different index of refraction or to use different materials in order to reduce the weight and/or the manufacturing costs.

In a more specific embodiment, a height of the protrusion over the face surface of the handling section is in the range of 500 to 680 micrometers.

In a further embodiment, the height of the protrusion over the face surface of the handling section is in the range of 600 to 650 micrometers. A typical height of a reinforcement or supporting structure of a thinned wafer is 650 to 680 micrometers, a typical thickness of semiconductor wafer is 700 micrometers and thinned portion of the wafer has typically a thickness of 20 to 80 micrometers, sometimes more, sometimes less. The height of the protrusion can be made less than, substantially equal to or even higher than the height of the reinforcement structure for reasons of easy alignment and/or good lithography resolution. This is discussed below in connection with FIG. 16.

The application discloses furthermore a method for producing a photolithography mask. A round protrusion is provided at the bottom of a handling section of the mask. The handling section can be square shaped to fit into a mask aligner and will has a larger horizontal cross section than the round protrusion. A face surface of the protrusion is provided at a level which is different from a face surface area of the handling section and a diameter of the round protrusion is slightly less than a diameter of a support structure at an outer rim of a wafer. An opaque layer, for example chrome or copper is provided at the bottom of the round protrusion and the opaque layer is patterned.

According to a further embodiment, the step of providing a mask aligner with a mask comprises a step of providing the round protrusion by creating a circular groove at the bottom of the mask. This embodiment is easy to machine since it can be made from a cube shaped specimen.

According to further embodiments, the step of creating a circular groove is executed before a step of providing the opaque layer, before the step of patterning the opaque layer or after the step of patterning the opaque layer.

The application furthermore discloses a method for photolithography of a wafer that provides a cost saving high resolution lithography for rim wafers. A wafer with a thinned inner portion and a supporting structure at an outer rim of the wafer is provided. At least part of the thinned inner portion is covered with a photo resist layer. A mask is provided in a mask aligner and is aligned such that a round protrusion of the mask is above the upper surface of the inner portion of the wafer and a handling section of the mask is provided above the upper surface of the supporting structure at different levels. The round protrusion of the mask is inserted at least partially into a circular region that is bounded by the supporting structure. The mask is illuminated with a light source from above. The round protrusion of the mask is lifted off from the circular region and the photo resist layer is processed, for example by etching. Further processing steps of the wafer are not mentioned here for brevity.

BRIEF DESCRIPTION OF THE DRAWINGS

The application is now explained in further detail with reference to the following figures in which FIG. 14 illustrates a first design of a chrome layer for mask according to the application, FIG. 15 illustrates a second design of a chrome layer for a mask according to the application, and FIG. 16 illustrates modifications of the embodiments.

DESCRIPTION OF EMBODIMENTS

Figure 1:
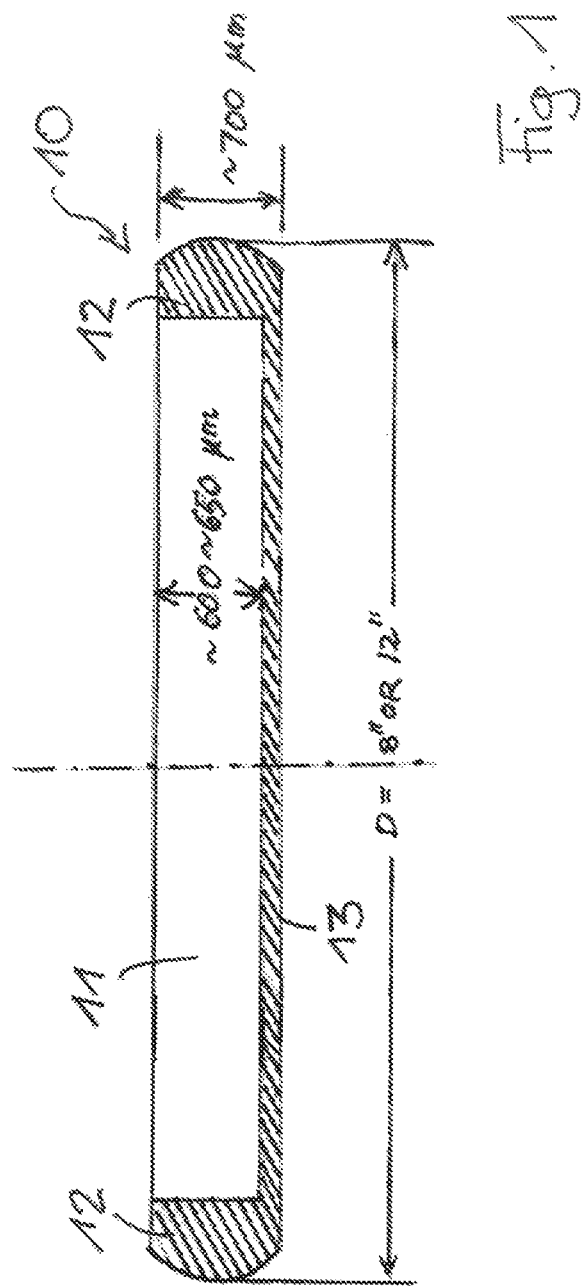
FIG. 1 illustrates a cross section through a rim wafer.

FIG. 1 shows a cross section of a rim wafer 10 having a recess 11 and a supporting structure 12. The diameter of the wafer 10 is typically 8" (200 mm) or 12" (300 mm), as it is common in today's semiconductor manufacturing. The height of the supporting structure 12 is usually in the range of 700 μm, which is the original thickness of the wafer 10. The supporting structure 12 has a width of ca. 2-3 mm at each side of the wafer 10. An inner portion 13 of the wafer 10, which is formed out at the bottom of the recess 11, has a thickness of ca. 50-100 μm, this means that 600-650 μm are removed by grinding, etching or other means.

Figure 2:
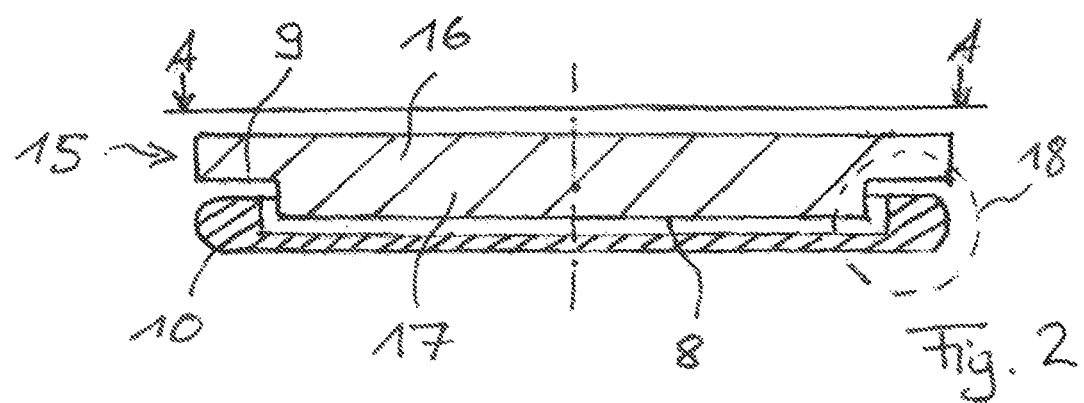
FIG. 2 illustrates a cross section through a mask according to the application and through a rim wafer.
Figure 3:
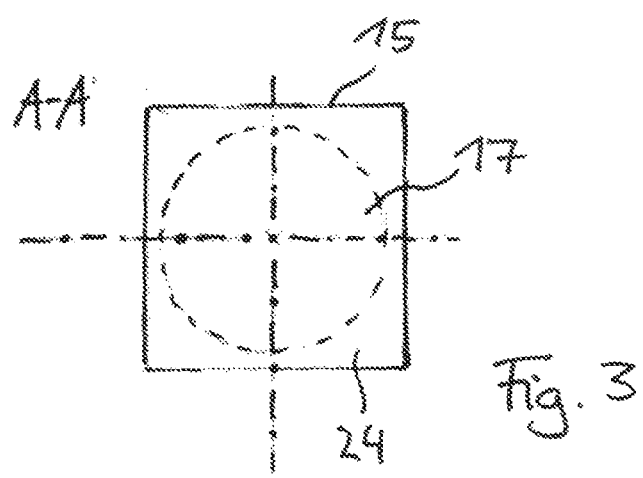
FIG. 3 illustrates a projection view of the mask of FIG. 2 onto the projection plane A-A.

A first embodiment of a mask 15 according to the application is shown in FIG. 2. The mask 15 comprises a square shaped handling section 16. A round protrusion 17 is provided at the bottom of the square shaped handling section 16. The square shape of the handling section 16 and the round shape of the protrusion 17 is best seen in FIG. 3 which shows a projection of the mask 15 onto the projection plane A-A of FIG. 2. A face surface 8 of the round protrusion 17 is provided at a lower height than a face surface 9 of the handling section 16.

Figure 4:
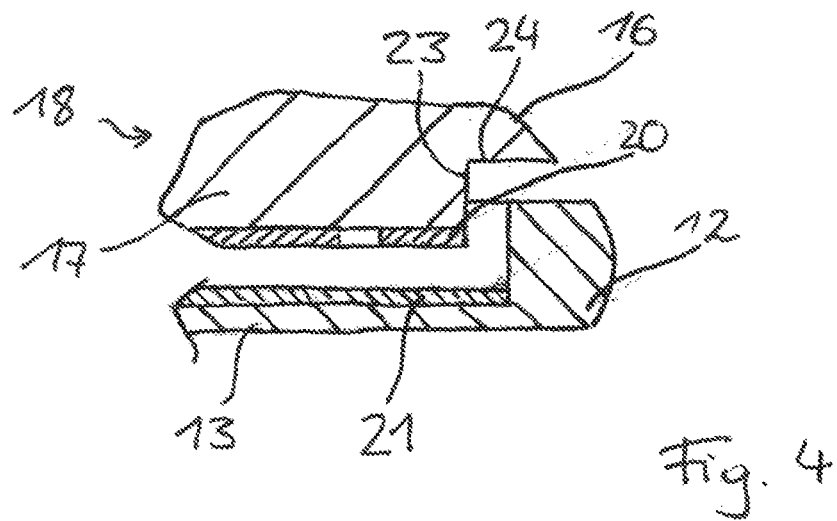
FIG. 4 illustrates an enlarged section of the cross section of FIG. 2.

The round protrusion 17 is characterized by the following features, which can be seen in FIG. 2 and in the enlarged cross section 18 of FIG. 4:

a) the diameter of the round protrusion 17 is slightly smaller than the diameter of the inner thinned portion 13 of the wafer 10, b) the height of the round protrusion 17 is roughly as big as the depth of the recess 11, e.g. 600-650 μm, c) the bottom of the protrusion 17 comprises chrome structures 20. The chrome structures 20 define a pattern in a resist 21 which is provided on top of the thinned portion 13.

Furthermore, a chrome layer may be provided at a sidewall 23 of the protrusion 17. Likewise, a patterned chrome layer may be provided at the handling section 16 of the mask. The further chrome layers are not shown in FIG. 4 but, they can be seen in FIG. 15 which shows a further embodiment of a mask. Advantageously, the handling section 16 of the mask has essentially the same dimension as a standard mask to enable a compatibility with existing mask aligners.

By using a mask according to the application, the round protrusion 17 of the mask 15 can be brought within close contact to the inner thinned portion 13 of the wafer 10. According to an embodiment of the application, the handling section 16 of the mask 15 does not come in contact with the supporting structure 12 at the rim of the mask 15. By placing the protrusion 17 close to the inner portion 13, the diffraction can be minimized. This enables a high-resolution lithography, by which even small features can be replicated with high accuracy.

Figure 5:
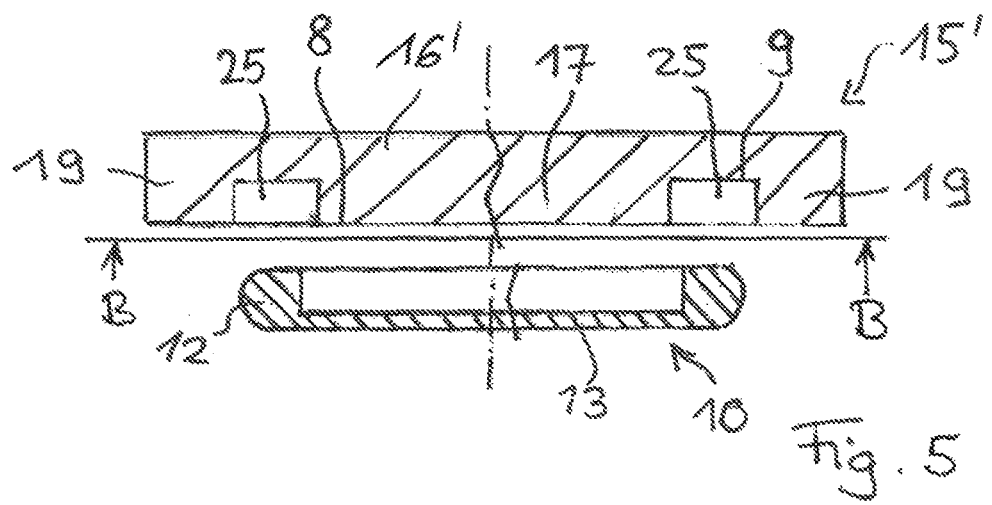
FIG. 5 illustrates a cross section through a second embodiment of a mask according to the application and through a rim wafer.
Figure 6:
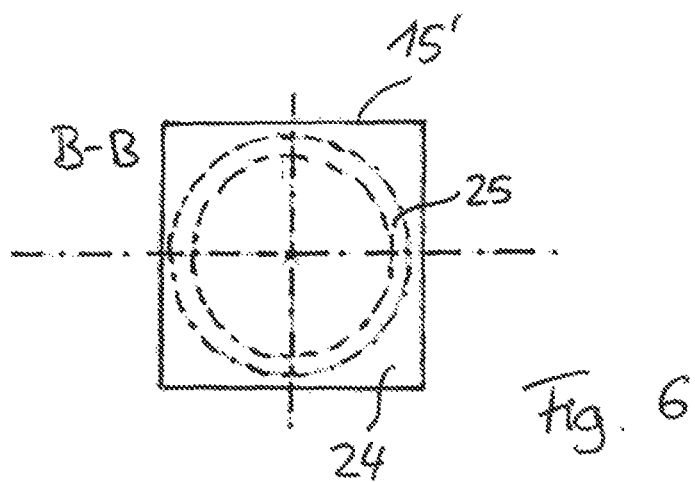
FIG. 6 illustrates a projection view of the mask of FIG. 4 onto the projection plane B-B.
Figure 7:
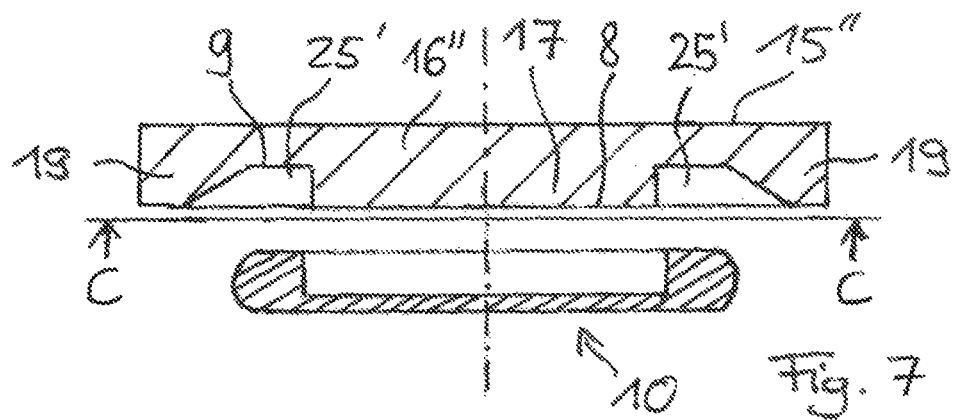
FIG. 7 illustrates a cross section through a third embodiment of a mask according to the application and through a rim wafer.

Another embodiment of a mask 15' according to the application is shown in FIG. 5. In the embodiment of FIG. 5, the square shaped mask 15' contains a ring-shaped groove 25 at the bottom of the mask 15'. The ringed shaped groove 25 divides the bottom of the mask 15' into an inner round protrusion 17 and an outer edge portion 19. In FIG. 6, the ring shape of the groove 25 is indicated by dashed lines. As can be seen in FIG. 7, the groove 25 is shaped in a way that the outer supporting rim 12 fits into the groove 25. The sides and bottom of the groove 25 may be completely or partially covered by a chrome layer, that is not shown in FIG. 5. This chrome layer may be patterned. Thereby, the whole mask 15' can be lowered onto the wafer 10 until the handling section 16 of the mask 15' comes into close contact with the inner thinned portion 13 of the wafer 10. The groove 25 can be created before the chrome-layer is applied, before the chrome-layer is patterned, or after the chrome-layer is patterned.

Figure 8:
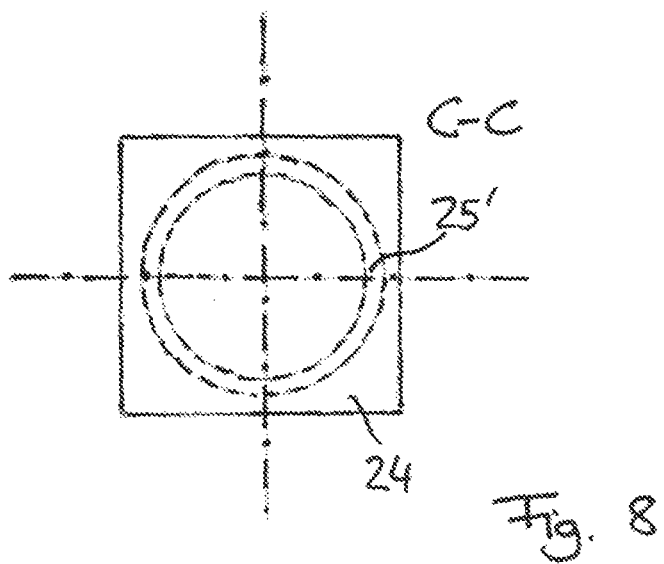
FIG. 8 illustrates a projection view of the mask of FIG. 7 onto the projection plane C-C.
Figure 9:
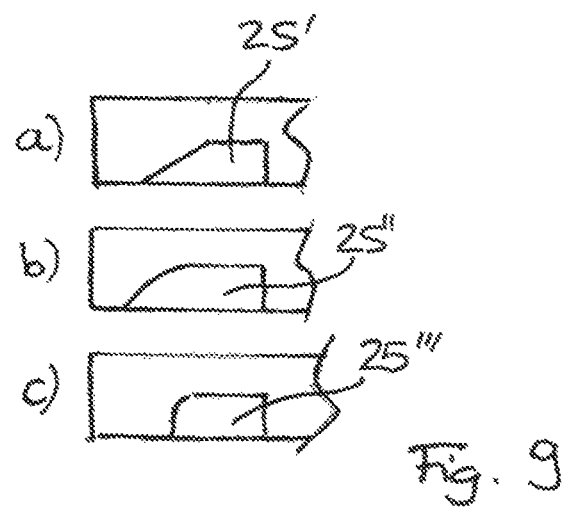
FIG. 9 illustrates enlarged portions of the mask of FIG. 7 and of two further modifications of the mask of FIG. 7.

FIGS. 7-9 show further developments of the mask of FIGS. 5-6. For simplicity, the masks are referred to with the same reference number 15". The groove 25 can take various shapes 25', 25", 25''' in order to minimize the stress from milling, and to enable a better spinning of any resists for the structuring of the chrome-layer.

FIG. 7 shows a cross section of a further embodiment of a mask 15" according to the application. FIG. 9 shows enlarged portions of the embodiment FIG. 7 and of modifications of this embodiment, wherein modification a) comprises a groove 25' with a ramp towards the edge portion 19 of the mask 15", modification b) comprises a groove 25" with a rounded portion towards the edge portion 19 of the mask 15", modification c) comprises a groove 25''' with a sigmoid shaped portion towards the edge portion 19 of the mask 15".

Figure 10:
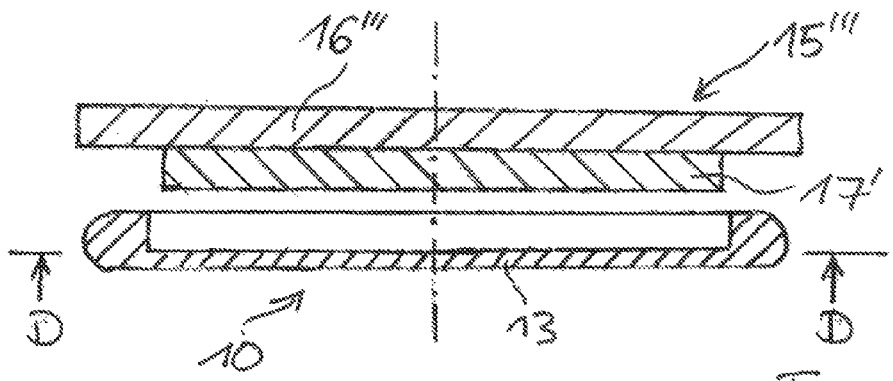
FIG. 10 illustrates a cross section of a further embodiment of a mask according to the application.
Figure 11:
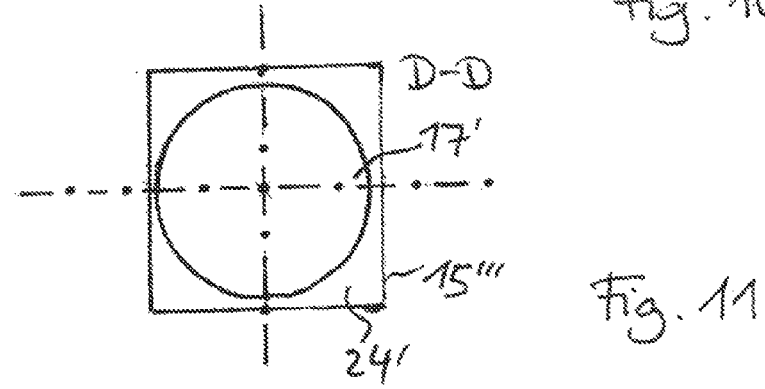
FIG. 11 illustrates a projection view of the mask of FIG. 10 onto the projection plane D-D.

A further embodiment of a mask 15''' is shown in FIG. 10. FIG. 11 shows a projection view of the mask 15''' of FIG. 10 onto the projection plane D-D. In the embodiment of FIG. 7, the mask 15''' is designed as a composite which comprises an upper square shaped handling section 16''' and a lower circular protrusion 17'.

Figure 12:
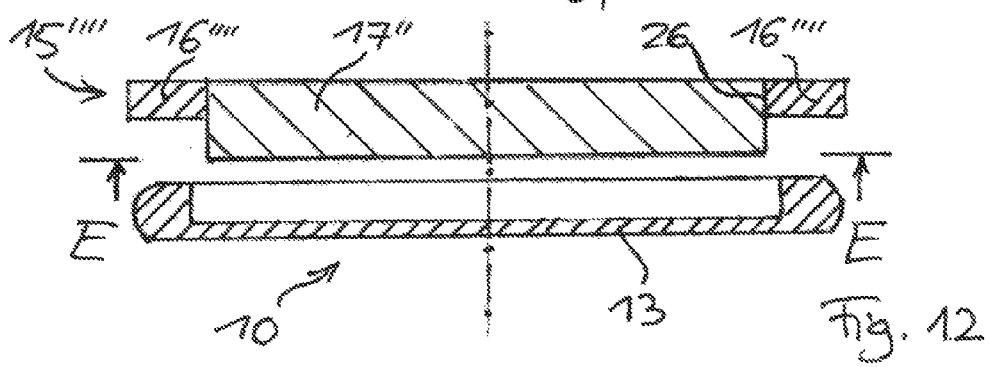
FIG. 12 illustrates a cross section of a further embodiment of a mask according to the application.
Figure 13:
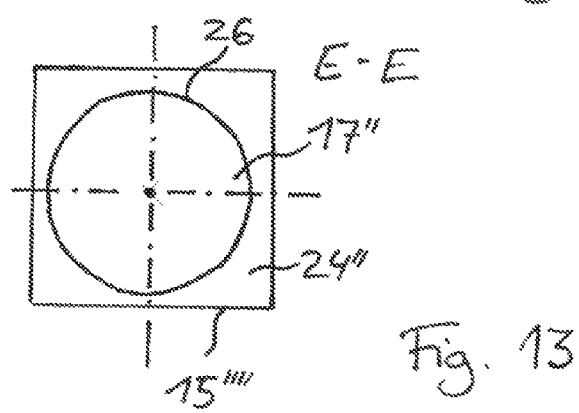
FIG. 13 illustrates a projection view of the mask of FIG. 12 onto the projection plane E-E.

A further embodiment of a mask 15'''' is shown in FIG. 12. FIG. 13 shows a projection view of the mask 15'''' of FIG. 12 onto the projection plane E-E. In the embodiment of FIG. 7, the mask 15'''' is designed as a composite, consisting of a square shaped handling section 16'''' having a cut-out 26 in the centre of the handling section 16''''. The diameter of the cut out 26 in the handling section 16'''' is slightly less than the diameter of the inner thinned portion 13 of the wafer 10. In this cut-out 26, a round disc 17" is placed, which has chrome structures at the bottom, that are not shown in FIG. 12. The thickness of the round disc 17" is higher than the handling section 16'''', so that the lower portion of the round disc 17" protrudes from the handling section 16''''. When the composite mask 15'''' is lowered onto the wafer 10, the protruding disc 17" of the mask 15'''' can get in close contact with the inner thinned portion 13 of the wafer 10.

For all masks 15-15''', hereafter referred as mask 15, further modifications are possible with regards to the chrome layer and the patterning of this layer. The protrusion 17, that is coming in close contact to the thinned inner portion 13 of the wafer 10, is also referred to as the "round portion" of the mask. The handling section 16-16'''' of the mask 15 that is carrying the round portion is also referred to as "square portion" of the mask 15. The handling section comprises a shape that fits into the mask aligner. It has typically a square shape but it may also be provided in a rectangle or other shape. Furthermore, the "sidewall" is defined as the area of the mask 15 which is the transition area from the "round portion" to the "square portion".

Advantageously, a structured chrome layer is provided at the round portion to enable photolithography. Depending on preferences, the square portion may or may not have a chrome-layer:

1. If a positive resist 21, 21' is used, the resist 21, 21' is completely removed at the supporting rim 12 and no chrome layer 20, 20' is required at the square portion.

2. If a positive resist 21, 21' is used, the resist 20, 21' remains at the supporting rim 12 and there should be an unstructured chrome layer 20, 20' at the square portion, so that no light passes through the square portion.

3. If a negative resist 21, 21' is used, the above considerations apply, but with an opposite distribution of the chrome layers 20, 20': no chrome layer 20, 20' if the resist 21, 21' shall remain and a full unstructured chrome layer 20, 20' if the resist 21, 21' shall be removed.

4. If the resist 21, 21' (positive or negative) is structured, for example for test structures, then the square portion of the mask 15 must have a structured chrome layer 20, 20'.

Similar modifications can be done to the side wall of the mask 15. Depending on process preferences, this area can be covered by chrome 20, 20' or left blank.

FIGS. 14 and 15 show, by way of example, two designs of a chrome layer 20, 20' at the bottom of a round portion 17' and of a resist layer 21' at the top of the wafer 10. According to FIG. 14, a chrome layer covers a bottom portion of the round portion 17' of the mask. A resist layer 21' covers the thinned portion 13, an inner sidewall of the supporting structure 12 and the top of the supporting structure 12.

According to FIG. 15, a chrome layer 20' covers the bottom of a sidewall of the round portion 17' of the mask. A portion 27 of the chrome layer 20' covers a bottom portion of the handling section 16''' outside the round portion 17'. As in FIG. 14, a resist layer 21' covers the thinned portion 13 of the wafer 10, an inner sidewall, and a portion 28 of the resist layer 21' covers the top of the supporting structure 12.

Further modifications a), b), c), d) are shown in FIG. 16. These modifications apply to all previously mentioned embodiments. For simplicity, the various embodiments of the mask 15 are referred to as mask 15. Depending on the thickness of the round bottom part 17 of the mask 15, several variations with regards to the contact modes between mask 15 and wafer 10 can be accomplished which can be adapted to the desired application.

The modifications a), b), c), d) apply to the embodiments of FIGS. 2 to 9 in which the mask 15, 15' or 15'' comprises a single piece with a square portion 16, 16' or 16'' and a round portion 17 as well the embodiments of FIGS. 10 to 13 in which the mask 15''' or 15'''' comprises two pieces with a square portion 16''' or 16'''' and a round portion 17' or 17''.

a) The round portion 17 of the mask 15 is thinner than the recess 13 of the wafer 10. In this case, the square portion 16 of the mask 15 can get in contact with supporting rim 12 of the wafer 10, while the round portion 17 of the mask 15 does not have any contact with thinned inner portion 13 of the wafer 10. Thereby, a precise gap height can be provided.

b) The mask 15 is fixed in the mask aligner in a way that it does not get in contact with any parts of the wafer 10. Thereby, a mechanical contact is avoided.

c) If the round portion 17 is thicker than the recess 11 of the wafer, the round portion 17 of the mask can get in direct contact with the central thinned part 13 of the wafer 10 in a way that the square portion of the mask 15 does not touch the wafer 10 at all. This configuration is also referred to as "full contact mode".

d) If the round portion 17 is as thick as the recess 11, both parts of the mask 15 get in direct contact with the wafer 10.

REFERENCE

8 face surface of protrusion
9 face surface of handling section
10 wafer
11 recess
12 supporting rim
13 thinned portion
15 mask
16 handling section
17 round protrusion
18 enlarged cross section
19 edge portion
20, 20' chrome structures/layer
21, 21' resist layer
23 sidewall
25, 25', 25", 25''' groove
26 circular cut-out
27 portion of chrome layer 20'
28 portion of resist layer 21'

The invention claimed is:

1. A photolithography mask for a semiconductor wafer, the mask comprising:
   a handling section having an outer shape being provided for handling by a mask aligner;
   a protrusion section that protrudes from the handling section of the mask; and
   wherein a face surface of the protrusion section is provided at a level which is different from a face surface area of the handling section.

2. The mask according to claim 1, wherein the protrusion section has a circular shape.

3. The mask according to claim 1, wherein the face surface area of the handling section includes a circular groove.

4. The mask according claim 3, wherein the circular groove comprises a ramp towards an edge portion of the handling section.

5. The mask according claim 3, wherein the circular groove comprises a rounded portion towards an edge portion of the handling section.

6. The mask according to claim 3, wherein the circular groove comprises a sigmoid shaped portion towards an edge portion of the mask.

7. The mask according to claim 1, wherein the handling section comprises a square shape and the protrusion comprises a circular shape.

8. The mask according to claim 7, wherein a cut-out is provided in the center of the handling section and wherein the protrusion is provided in the cut-out.

9. The mask according to claim 1, wherein a height of the protrusion over the face surface of the handling section is in a range of 500 to 680 micrometers.

10. The mask according to claim 9, wherein a height of the protrusion over the face surface of the handling section is in a range of 600 to 650 micrometers.

11. A method for producing a photolithography mask, comprising:
   providing a round protrusion at the bottom of a handling section of the mask, so that a face surface of the protrusion is provided at a level which is different from a face surface area of the handling section;
   providing an opaque layer at the bottom of the round protrusion; and
   patterning the opaque layer.

12. The method according to claim 11, further comprising:
   providing a mask aligner with a mask; and
   providing the round protrusion by creating a circular groove at the bottom of the mask.

13. The method according to claim 12, wherein the creating the circular groove is executed before the patterning the opaque layer.

14. The method according to claim 13, wherein the patterning the opaque layer is executed before the creating the circular groove.

15. A photolithography method for a wafer using a mask comprising:
- providing a wafer with a thinned inner portion and a supporting structure of the wafer;
- covering at least part of the thinned inner portion with a photo resist layer;
- providing a mask such that a protrusion of the mask is provided above an upper surface of an inner portion of the wafer and a handling section of the mask is provided above an upper surface of the supporting structure at different levels;
- illuminating the mask with a light source from above;
- lifting off the protrusion of the mask; and
- processing the photo resist layer.

\* \* \* \* \*